(12) United States Patent
Tomori et al.

(10) Patent No.: US 11,908,762 B2
(45) Date of Patent: Feb. 20, 2024

(54) TEMPORARY PROTECTIVE FILM FOR SEMICONDUCTOR SEALING MOLDING, LEAD FRAME WITH TEMPORARY PROTECTIVE FILM, SEALED MOLDED BODY WITH TEMPORARY PROTECTIVE FILM, AND METHOD FOR PRODUCING SEMICONDUCTOR DEVICE

(71) Applicant: HITACHI CHEMICAL COMPANY, LTD., Tokyo (JP)

(72) Inventors: Naoki Tomori, Tokyo (JP); Tomohiro Nagoya, Tokyo (JP); Takahiro Kuroda, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 88 days.

(21) Appl. No.: 16/979,678

(22) PCT Filed: Mar. 1, 2019

(86) PCT No.: PCT/JP2019/008212
§ 371 (c)(1),
(2) Date: Sep. 10, 2020

(87) PCT Pub. No.: WO2019/176597
PCT Pub. Date: Sep. 19, 2019

(65) Prior Publication Data
US 2021/0050274 A1  Feb. 18, 2021

(30) Foreign Application Priority Data
Mar. 12, 2018  (JP) .................................. 2018-044203

(51) Int. Cl.
C09J 7/29       (2018.01)
H01L 23/31      (2006.01)
C09J 7/38       (2018.01)
H01L 21/56      (2006.01)
H01L 23/495     (2006.01)
B32B 7/027      (2019.01)
C09J 201/02     (2006.01)

(52) U.S. Cl.
CPC .......... *H01L 23/3142* (2013.01); *B32B 7/027* (2019.01); *C09J 7/29* (2018.01); *C09J 7/38* (2018.01); *H01L 21/561* (2013.01); *H01L 23/49579* (2013.01); *C09J 201/02* (2013.01)

(58) Field of Classification Search
None
See application file for complete search history.

(56) References Cited

U.S. PATENT DOCUMENTS

| | | | | |
|---|---|---|---|---|
| 6,700,185 B1* | 3/2004 | Kawai | ...................... | C09J 7/35 |
| | | | | 156/289 |
| 11,251,055 B2* | 2/2022 | Kuroda | ............... | H01L 23/3107 |
| 2006/0043607 A1* | 3/2006 | Matsuura | .............. | H01L 21/568 |
| | | | | 257/782 |
| 2007/0158869 A1* | 7/2007 | Yanagida | ................ | B32B 15/08 |
| | | | | 428/474.7 |
| 2009/0022939 A1* | 1/2009 | Yanagida | .............. | B32B 27/281 |
| | | | | 428/101 |
| 2009/0053498 A1 | 2/2009 | Matsuura et al. | | |
| 2020/0118841 A1* | 4/2020 | Tomori | ................ | H01L 21/568 |
| 2021/0395577 A1* | 12/2021 | Kuroda | .................... | C09J 7/385 |

FOREIGN PATENT DOCUMENTS

| | | | |
|---|---|---|---|
| JP | 2012-059846 A | 3/2012 |
| JP | 2013-040276 A | 2/2013 |
| JP | 2016-196322 A | 11/2016 |
| KR | 10-2002-0044586 A | 6/2002 |
| KR | 1020020060143 A | 7/2002 |
| KR | 10-2005-0024396 A | 3/2005 |
| KR | 1020160029070 A | 3/2016 |
| KR | 1020170049448 A | 5/2017 |
| KR | 1020180022532 A | 3/2018 |
| TW | 538427 B | 6/2003 |
| TW | 200423316 A | 11/2004 |
| WO | 01/035460 A1 | 5/2001 |
| WO | 2004/075293 A1 | 9/2004 |

* cited by examiner

*Primary Examiner* — Anish P Desai
(74) *Attorney, Agent, or Firm* — FITCH, EVEN, TABIN & FLANNERY, LLP

(57) ABSTRACT

A temporary protective film comprising a support film and an adhesive layer provided on one surface or both surfaces of the support film is disclosed. The coefficient of linear expansion at 30° C. to 200° C. of the temporary protective film may be greater than or equal to 16 ppm/° C. and less than or equal to 20 ppm/° C. in at least one in-plane direction of the temporary protective film.

16 Claims, 8 Drawing Sheets

A

B

TEMPORARY PROTECTIVE FILM FOR SEMICONDUCTOR SEALING MOLDING, LEAD FRAME WITH TEMPORARY PROTECTIVE FILM, SEALED MOLDED BODY WITH TEMPORARY PROTECTIVE FILM, AND METHOD FOR PRODUCING SEMICONDUCTOR DEVICE

CROSS-REFERENCE TO RELATED APPLICATIONS

This application is a U.S. national phase application filed under 35 U.S.C. § 371 of International Application No. PCT/JP2019/008212, filed Mar. 1, 2019, designating the United States, which claims priority from Japanese Patent Application 2018-044203, filed Mar. 12, 2018, which are hereby incorporated herein by reference in their entirety.

TECHNICAL FIELD

The present invention relates to a temporary protective film for semiconductor sealing molding, a lead flame with temporary protective film, a sealed molded body with temporary protective film, and a method for producing semiconductor device.

BACKGROUND ART

Conventionally, semiconductor packages having a structure in which a semiconductor element is adhered onto a die pad by means of an adhesive such as a silver paste, this is joined to a lead frame with a wire, and then the entirety is sealed while an outer lead for external connection is left, have been used. However, as there is a stronger demand for density increase, area reduction, thickness reduction, and the like in recent years, semiconductor packages having various structures have been suggested. As such a semiconductor package, a semiconductor package having a structure in which only one surface (semiconductor element side) of the package is sealed, and a lead frame exposed at the rear surface is used for external connection, has been developed (for example, QuadFlat Non-leaded (QFN) package). Since a package having this structure does not have a lead frame protruded from the sealing resin, area reduction and thickness reduction can be promoted. However, there are occasions in which defects such as the sealing resin wrapping around the rear surface of the lead frame at the time of sealing molding occur.

As a method for preventing such defects, a method of attaching an adhesive film for semiconductor as a temporary protective film to the rear surface of the lead frame, thereby protecting the lead frame rear surface, sealing molding the semiconductor element mounted on the lead frame front surface side, and then tearing off the temporary protective film, is known. (for example, Patent Literature 1).

CITATION LIST

Patent Literature

Patent Literature 1: International Publication WO 2001/035460

SUMMARY OF INVENTION

Technical Problem

It is desirable that after a temporary protective film used for semiconductor sealing molding is attached to the lead frame, the lead frame does not warp. When the warpage of the lead frame is significant, problems may occur in view of mass productivity, such as that the lead frame is caught during conveyance and cannot be conveyed, that the lead frame cannot be vacuum fixed to the apparatus, and that wire deformation occurs.

The adhesive film for semiconductor of Patent Literature 1 is a film that can easily cause the occurrence of warpage; however, in a case in which the adhesive film for semiconductor is used for conventional lead frames, there have been no significant problems. However, as a result of film thickness reduction, width increase, and density increase (chip size reduction) of lead frames in recent years, the requirements on warpage of the lead frame have become strict, and for the adhesive film for semiconductor of Patent Literature 1, it has been found that it is difficult to avoid the influence of warpage after adhesion under high-temperature and high-pressure conditions (for example, 200° C. to 250° C., 3 to 8 MPa) and after moisture absorption.

Thus, it is an object of the present invention to provide a temporary protective film for semiconductor sealing molding that can suppress warpage of a lead frame after adhesion under high-temperature and high-pressure conditions and after moisture absorption.

Means for Solving the Problems

The inventors of the present invention conducted a thorough investigation in order to solve the problems described above, and as a result, the inventors found that the problems can be solved by adjusting the coefficient of linear expansion (CTE), thus completing the present invention.

A first aspect of the present invention relates to a temporary protective film for semiconductor sealing molding comprising a support film and an adhesive layer provided on one surface or both surfaces of the support film, in which a coefficient of linear expansion at 30° C. to 200° C. of the temporary protective film is greater than or equal to 16 ppm/° C. and less than or equal to 20 ppm/° C. in at least one in-plane direction of the temporary protective film.

The elastic modulus at 30° C. of the temporary protective film may be 9 GPa or lower.

The elastic modulus at 230° C. of the adhesive layer may be 1 MPa or higher.

The adhesive layer may contain a thermoplastic resin having an amide group, an ester group, an imide group, an ether group, or a sulfone group, or may contain a thermoplastic resin having an amide group, an ester group, an imide group, or an ether group.

The support film may be a film of a polymer selected from the group consisting of an aromatic polyimide, an aromatic polyamide, an aromatic polyamideimide, an aromatic polysulfone, an aromatic polyethersulfone, a polyphenylene sulfide, an aromatic polyether ketone, a polyallylate, an aromatic polyether ether ketone, and polyethylene naphthalate.

The adhesive layer may be provided on one surface of the support film, and a ratio of a thickness of the adhesive layer to a thickness of the support film may be 0.2 or less.

The temporary protective film may include a non-adhesive layer provided on a surface of the support film, the surface being on the opposite side of the surface provided with the adhesive layer.

A ratio of a thickness of the adhesive layer to a thickness of the non-adhesive layer may be 1.0 to 2.0.

An aspect of the present invention relates to a reel body including a winding core and the temporary protective film for semiconductor sealing molding wound around the wining core.

An aspect of the present invention relates to a package comprising the reel body; and a packaging bag accommodating the reel body.

An aspect of the present invention relates to a packing material, comprising the package; and a packing box accommodating the package.

An aspect of the present invention relates to a temporary protective film-attached lead frame, comprising: a lead frame having a die pad and an inner lead; and the temporary protective film, wherein the temporary protective film is attached to the lead frame in a direction in which the adhesive layer of the temporary protective film comes into contact with one surface of the lead frame, and an in-plane direction of the temporary protective film, in which the coefficient of linear expansion at 30° C. to 200° C. is higher than or equal to 16 ppm/° C. and lower than or equal to 20 ppm/° C., runs parallel to a shorter side of the lead frame in a case where the outer periphery of the lead frame has a rectangular shape, and parallel to any one side in a case where the outer periphery of the lead frame has a square shape.

An aspect of the present invention relates to a temporary protective film-attached lead frame, comprising: a lead frame having a die pad and an inner lead; and the temporary protective film, wherein the temporary protective film is attached to the lead frame in a direction in which the adhesive layer of the temporary protective film comes into contact with one surface of the lead frame.

An aspect of the present invention relates to a method for producing a semiconductor device, comprising, in the following order: a step of attaching the temporary protective film for semiconductor sealing molding on one surface of a lead frame having a die pad and an inner lead, in a direction in which an adhesive layer of the temporary protective film comes into contact with the lead frame, and an in-plane direction of the temporary protective film, in which the coefficient of linear expansion at 30° C. to 200° C. is higher than or equal to 16 ppm/° C. and lower than or equal to 20 ppm/° C., runs parallel to a shorter side in a case where the outer periphery of the lead frame is a rectangular shape, and parallel to any one side in a case where the outer periphery of the lead frame has a square shape; a step of mounting a semiconductor element on a surface of the die pad, the surface being on the opposite side of the temporary protective film; a step of providing a wire for connecting the semiconductor element and the inner lead; a step of forming a sealing layer sealing the semiconductor element and the wire, and thereby obtaining a sealing molded body having a lead frame, a semiconductor element, and a sealing layer; and a step of peeling off the temporary protective film from the sealing molded body.

It is desirable that the lead frame has a plurality of die pads, and a semiconductor element is mounted on each of the plurality of die pads, and the method further comprises a step of dividing the sealing molded body before or after peeling off the temporary protective film from the sealing molded body, and thereby obtaining semiconductor devices each having one die pad and one semiconductor element.

Advantageous Effects of Invention

According to the present invention, there is provided a temporary protective film for semiconductor sealing molding that can suppress warpage of a lead frame caused by shrinkage at the time of cooling after adhesion under high-temperature and high-pressure conditions, and warpage of a lead frame attributable to expansion of a film caused by moisture adsorption. Thereby, a semiconductor device can be produced with high workability and productivity.

In conventional temporary protective films, the warpage of a lead frame is large after adhesion thereof; however, even in a case in which warpage is decreased after moisture absorption and expansion, moisture is exhausted as heat is applied during the production process, and the lead frame may return to the original state of large warpage. In the temporary protective film of the present invention, such a warpage attribute to moisture exhaust is also suppressed.

DESCRIPTION OF EMBODIMENTS

Hereinafter, suitable embodiments of the present invention will be explained in detail. However, the present invention is not intended to be limited to the following embodiments. The upper limits and the lower limits of the value ranges described in the present specification can be arbitrarily combined. The values described in Examples can also be used as the upper limits or lower limits of value ranges.

<Temporary Protective Film>

Figure 1:
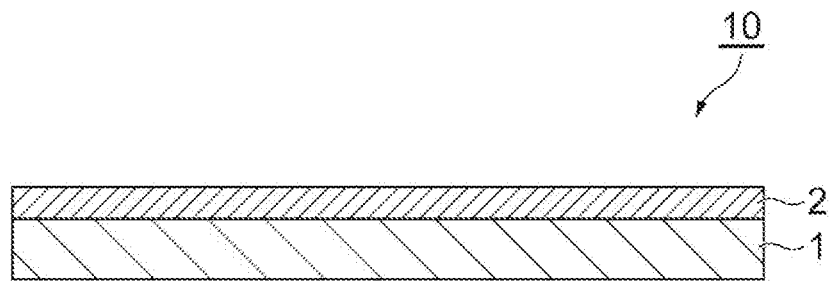
FIG. 1 is a cross-sectional view illustrating an embodiment of a temporary protective film.

FIG. 1 is a cross-sectional view illustrating a temporary protective film according to an embodiment. The temporary protective film 10 illustrated in FIG. 1 is composed of a support film 1 and an adhesive layer 2 provided on one surface of the support film 1. An adhesive layer may be formed on both surfaces of the support film 1.

Figure 2:
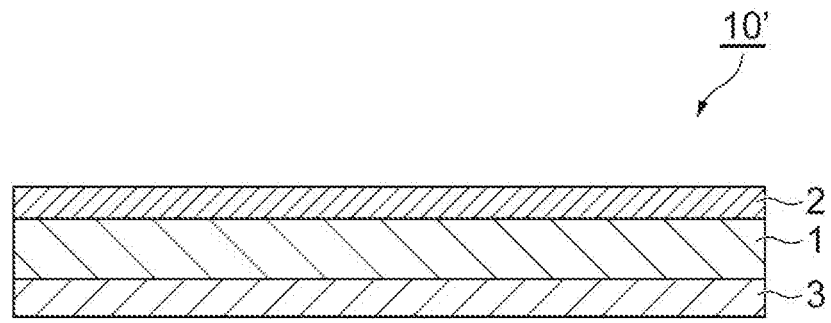
FIG. 2 is a cross-sectional view illustrating an embodiment of a temporary protective film.

FIG. 2 is also a cross-sectional view illustrating the temporary protective film according to an embodiment. The temporary protective film 10' of FIG. 2 has a support film 1; an adhesive layer 2 provided on one of principal surfaces of the support film 1; and a resin layer (non-adhesive layer 3) that is provided on the other principal surface of the support film 1 and substantially does not have adhesiveness. These temporary protective films can be used, in a process for sealing molding of forming a sealing layer that seals a semiconductor element mounted on a lead frame, as temporary protective films for semiconductor sealing molding for temporarily protecting lead frames during sealing molding, by attaching a temporary protective film on the rear surface of the lead frame (surface on the side opposite to the surface where the semiconductor element is mounted).

The coefficient of linear expansion at 30° C. to 200° C. of the temporary protective film may be greater than or equal to 16 ppm/° C. and less than or equal to 20 ppm/° C. in at least one in-plane direction of the temporary protective film. The at least one in-plane direction may be at least one in-plane direction selected from the group consisting of the MD direction (Machine direction) and the TD direction (Transverse direction), and is desirably the TD direction. The MD direction is usually the longitudinal direction of the support film. The TD direction is a direction perpendicular to the MD direction. Measurement of the coefficient of linear expansion can be measured using a thermomechanical analyzer (for example, manufactured by Seiko Instruments, Inc., Model SSC5200). The coefficient of linear expansion at 30° C. to 200° C. in at least one direction of the temporary protective film can be adjusted by, for example, adjusting the thickness of the adhesive layer.

The elastic modulus at 30° C. of the temporary protective film is desirably 9 GPa or less. The elastic modulus at 30° C. of the temporary protective film may be 8 GPa or less or 7 GPa or less, and may be 4 GPa or greater or 5 GPa or greater. The elastic modulus at 30° C. of a temporary protective film can be measured by the following method. First, a specimen obtained by cutting out a temporary protective film into a size of 4 mm×30 mm is mounted on a dynamic viscoelasticity measuring apparatus (manufactured by UBM Co., Ltd., Rheogel-E4000), and the distance between chucks is set to 20 mm. The elastic modulus can be determined by measuring the tensile modulus of the mounted specimen under the conditions of sinusoidal waves, a temperature range maintained constant at 30° C., and a frequency of 10 Hz.

<Adhesive Layer>

The adhesive layer may be provided on one surface of the support film, or may be provided on both surfaces of the support film in order to offset the curl of the temporary protective film, which is attributed to volume reduction of the adhesive layer at the time of solvent removal.

The method for forming an adhesive layer on a support film is not particularly limited; however, for example, a varnish for forming an adhesive layer (resin varnish), which is produced by dissolving a resin used for the formation of an adhesive layer (hereinafter, also referred to as "resin (a)") in a solvent such as N-methyl-2-pyrrolidone, dimethylacetamide, diethylene glycol dimethyl ether, tetrahydrofuran, cyclohexanone, methyl ethyl ketone, or dimethylformamide, is applied on one surface or both surfaces of a support film, subsequently the varnish is subjected to heating to remove the solvent, and thereby an adhesive layer containing the resin (a) can be formed on one surface or both surfaces of the support film. An adhesive layer containing a resin (a) can also be formed by applying a varnish (precursor varnish) for forming an adhesive layer, obtained by dissolving an precursor (for example, polyamic acid) of the resin (a) (for example, a polyimide resin), which becomes the resin (a) by a heating treatment or the like after varnish application, in a solvent, on one surface or both surfaces of a support film, and then heat-treating the varnish. In this case, the solvent is removed by the heating treatment after application of the precursor varnish, and at the same time, the precursor of the resin (a) becomes the resin (a) (for example, imidization). The resin (a) is desirably a heat-resistant resin. From the viewpoint of the surface state of the coated surface, it is acceptable to use a resin varnish.

The treatment temperature employed at the time of heat-treating the support film after being coated with a varnish for forming an adhesive layer for the purpose of removal of the solvent, imidization, and the like, may differ depending on whether a resin varnish is used or a precursor varnish is used. The treatment temperature may be, in the case of a resin varnish, any temperature at which the solvent can be removed, and in the case of a precursor varnish, the treatment temperature may be any temperature higher than or equal to the glass transition temperature of the adhesive layer in order to form a resin from the precursor (for example, imidization).

The method of applying a resin varnish or a precursor vanish on one surface of a support film is not particularly limited; however, for example, roll coating, reverse roll coating, gravure coating, bar coating, comma coating, die coating, or reduced pressure die coating can be used. Application may also be achieved by passing a support film through a resin varnish or a precursor varnish.

The glass transition temperature (Tg) of the adhesive layer may be 100° C. or higher, and may be 150° C. or higher. The glass transition temperature (Tg) of the adhesive layer may be 300° C. or lower, and may be 250° C. or lower. In a case in which the glass transition temperature is 100° C. or higher, there is a tendency that when the temporary protective film is torn off from the lead frame and the sealing material, peeling at the interface between the adhesive layer and the support film is easily suppressed, and the adhesive layer is not easily subjected to cohesive destruction. In a case in which the glass transition temperature is 100° C. or higher, there is a tendency that the adhesive layer does not easily remain on the lead frame and the sealing material, the adhesive layer is not easily softened by heat in a wire bonding process, and defective bonding of wire does not easily occur. Furthermore, there is a tendency that defects such as that the resin layer is not easily softened by heat in the sealing process, and the sealing material penetrates between the lead frame and the adhesive layer, do not easily occur. In a case in which the glass transition temperature is 300° C. or lower, there is a tendency that softening of the adhesive layer is sufficiently suppressed at the time of adhesion, and a decrease in the peel strength at a peeling angle of 90 degrees between the temporary protective film and the lead frame occurring at normal temperature (for example, 25° C.) is easily suppressed.

The glass transition temperature can be measured using a thermomechanical analyzer (manufactured by Seiko Instruments, Inc., Model SSC5200) in a tensile mode under the conditions of a distance between chucks of 10 mm, a temperature range of 30° C. to 300° C., and a rate of temperature increase of 10° C./min.

The 5% weight reduction temperature of the adhesive layer may be 300° C. or higher, may be 350° C. or higher, and may be 400° C. or higher. In a case in which the temperature at which the adhesive layer undergoes 5% weight reduction is 300° C. or higher, there is a tendency that outgases generated by the heat produced at the time of attaching the temporary protective film to a lead frame and the heat of the wire bonding process are not easily produced, and contamination of the lead frame, wires, and the like is easily suppressed. The 5% weight reduction temperature can be measured using a differential thermal balance (manufactured by Seiko instruments, Inc., Model SSC5200) in an air atmosphere under the conditions of a rate of temperature increase of 10° C./min.

The elastic modulus at 230° C. of the adhesive layer may be 1 MPa or higher, and may be 3 MPa or higher. Here, in regard to the production process for a semiconductor device, the temperature in the wire bonding process (wire bonding temperature) is not particularly limited; however, the temperature is generally about 200° C. to 260° C., and a temperature of more or less 230° C. is widely used. Therefore, in a case in which the elastic modulus at 230° C. is 1 MPa or higher, there is a tendency that softening of the adhesive layer caused by the heat produced in a wire bonding process is suppressed, and defective wire bonding does not easily occur. The upper limit of the elastic modulus at 230° C. of the adhesive layer may be 2,000 MPa, may be 1,500 MPa, and may be 1,000 MPa.

The elastic modulus at 230° C. of the adhesive layer can be measured using a dynamic viscoelasticity measuring apparatus (manufactured by UBM Co., Ltd., Rheogel-E4000) by setting the distance between chucks to 20 mm in a tensile mode with sinusoidal waves at a rate of temperature increase of 5° C./min and a frequency of 10 Hz.

The resin (a) used for the formation of the adhesive layer may be a thermoplastic resin having an amide group (—NHCO—), an ester group (—CO—O—), an imide group (—NR$_2$, provided that R's are each —CO—), an ether group (—O—), or a sulfone group (—SO$_2$—). Particularly, the resin (a) may be a thermoplastic resin having an amide group, an ester group, an imide group, or an ether group. Specific examples of the resin (a) include an aromatic polyamide, an aromatic polyester, an aromatic polyimide, an aromatic polyamideimide, an aromatic polyether, an aromatic polyether amideimide, an aromatic polyether amide, an aromatic polyester imide, and an aromatic polyether imide. Among these, the resin (a) may be at least one resin selected from the group consisting of an aromatic polyether amideimide, an aromatic polyether imide, and an aromatic polyether amide, from the viewpoints of heat resistance and adhesiveness.

The above-described resins can all be produced by subjecting an aromatic diamine, a bisphenol, or the like, which are basic components, and a dicarboxylic acid, a tricarboxylic acid, a tetracarboxylic acid, or an aromatic chloride, which are acidic components, or reactive derivatives thereof to polycondensation. That is, the polycondensation can be carried out by a conventional method that is used for a reaction between an amine and an acid, and there are no particular limitations on the various conditions and the like. With regard to a polycondensation reaction between an aromatic dicarboxylic acid, an aromatic tricarboxylic acid, or reactive derivatives thereof and a diamine, conventional methods are used.

As the basic component to be used for the synthesis of an aromatic polyether imide, an aromatic polyether amideimide, or an aromatic polyether amide, for example, an aromatic diamine having an ether group, such as 2,2-bis[4-(4-aminophenoxy)phenyl]propane, bis[4-(4-aminophenoxy)phenyl]sulfone, 4,4'-diaminodiphenyl ether, bis[4-(4-aminophenoy)phenyl]ether, or 2,2-bis[4-(4-aminophenoxy)] hexafluoropropane; an aromatic diamine having no ether group, such as 4,4'-methylenebis(2,6-diisopropylamine); a siloxanediamine such as 1,3-bis(3-aminopropyl)-tetramethyldisiloxane; and an α,ω-diaminoalkane such as 1,12-diaminododecane or 1,6-diaminohexane, may also be used. In the total amount of the basic component, the aromatic diamine having an ether group described above may be used in an amount of 40 mol % to 100 mol % or 50 mol % to 97 mol % and at least one selected from an aromatic diamine having no ether group, a siloxane diamine, and an α,ω-diaminoalkane may be used in an amount of 0 mol % to 60 mol % or 3 mol % to 50 mol %. Specific examples of the basic component include: (1) a basic component composed of 60 mol % to 89 mol % or 68 mol % to 82 mol % of an aromatic diamine having an ether group, 1 mol % to 10 mol % or 3 mol % to 7 mol % of a siloxane diamine, and 10 mol % to 30 mol % or 15 mol % to 25 mol % of an α,ω-diaminoalkane; (2) a basic component composed of 90 mol % to 99 mol % or 93 mol % to 97 mol % of an aromatic diamine having an ether group, and 1 mol % to 10 mol % or 3 mol % to 7 mol % of a siloxane diamine; and (3) a basic component composed of 40 mol % to 70 mol % or 45 mol % to 60 mol % of an aromatic diamine having an ether group, and 30 mol % to 60 mol % or 40 mol % to 55 mol % of an aromatic diamine having no ether group.

Examples of the acid component to be used for the synthesis of an aromatic polyether imide, an aromatic polyether amideimide, or an aromatic polyether amide, include: (A) trimellitic anhydride, a reactive derivative of trimellitic anhydride such as trimellitic anhydride chloride, a mononuclear aromatic tricarboxylic acid anhydride such as pyromellitic dianhydride, or a mononuclear aromatic tetracarboxylic acid dianhydride; (B) a polynuclear aromatic tetracarboxylic acid dianhydride such as bisphenol A bistrimellitate dianhydride or an oxydiphthalic anhydride; (C) an aromatic dicarboxylic acid such as terephthalic acid, isophthalic acid, or a reactive derivative of phthalic acid such as terephthalic acid chloride or isophthalic acid chloride; and the like. Among them, an aromatic polyether amideimide obtainable by reacting 0.95 to 1.05 mol or 0.98 to 1.02 mol of the above-mentioned acid component (A) per 1 mol of the above-mentioned basic component (1) or (2), and an aromatic polyether imide obtainable by reacting 0.95 to 1.05 mol or 0.98 to 1.02 mol of the above-mentioned acid component (B) per 1 mol of the above-mentioned basic component (3), may also be used.

The adhesive layer may further contain other components in addition to the resin (a). Examples of the other components include fillers such as a ceramic powder, powdered glass, powdered silver, powdered copper, resin particles, and rubber particles, and a coupling agent.

In a case in which the adhesive layer contains a filler as another component, the content of the filler may be 1 to 30 parts by mass, or may be 5 to 15 parts by mass, with respect to 100 parts by mass of the resin (a).

Regarding the coupling agent, a coupling agent such as a vinylsilane, an epoxysilane, an aminosilane, a mercaptosilane, a titanate, an aluminum chelate, or a zircoaluminate can be used; however, the coupling agent is desirably a silane coupling agent. The silane coupling agent may be a silane coupling agent having an organic reactive group at the terminal, such as vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, N-β-(aminoethyl)-γ-aminopropylmethyldimethoxysilane, γ-aminopropyltriethoxy silane, N-phenyl-γ-aminopropyltrimethoxysilane, or γ-mercaptopropyltrimethoxysilane, and among these, an epoxysilane coupling agent having an epoxy group may be used. Here, the Organic reactive group is a functional group such as an epoxy group, a vinyl group, an amino group, or a mercapto group. Addition of a silane coupling agent is intended to enhance the adhesiveness of the resin to the support film and to make it difficult for peeling to occur at an interface between the adhesive layer and a support film when the adhesive layer is torn off at a temperature of 100° C. to 300° C. In a case in which the adhesive layer contains a coupling agent as another component, the content of the coupling agent may be 1 to 15 parts by mass, and may be 2 to 10 parts by mass, with respect to 100 parts by mass of the resin (a).

The thickness (A) of the adhesive layer may be 20 μm or less, 18 μm or less, 16 μm or less, 14 μm or less, 12 μm or less, 10 μm or less, 9 μm or less, or 8 μm or less. The thickness (A) of the adhesive layer may be 1 μm or more, 2 μm or more, 3 μm or more, 4 μm or more, 5 μm or more, 6 μm or more, 7 or more, or 8 μm or more. The thickness (A) of the adhesive layer may be 1 to 20 or less, may be 1 to 15 or less, or may be 1 to 8 μm or less. In a case in which the thickness of the adhesive layer is 1 μm or more, sufficient adhesiveness can be secured, and there is a tendency that the sealing material is not likely to leak at the time of sealing. In a case in which the thickness (A) of the adhesive layer is 20 μm or less, the layer thickness of the temporary protective film is decreased, and the economic efficiency tends to be excellent. In addition to that, generation of voids at the time of performing a heat treatment at 300° C. or higher is further suppressed. Furthermore, in a case in which the thickness (A) of the adhesive layer is 20 μm or less, an increase of wettability at the time of heat treatment is suppressed, and strong attachment between the adherend and the adhesive layer is suppressed. Therefore, peelability becomes superior.

<Non-Adhesive Layer>

A non-adhesive layer is a resin layer that substantially does not have adhesiveness (or pressure-sensitive adhesiveness) to a lead frame at 0° C. to 270° C. The non-adhesive layer may be a resin layer that is not easily softened at high temperature, and for example, a resin layer having a high glass transition temperature can function as a non-adhesive layer.

The elastic modulus at 230° C. of the non-adhesive layer may be 10 MPa or higher, may be 100 MPa or higher, and may be 1,000 MPa or higher. In a case in which the elastic modulus at 230° C. of the non-adhesive layer is 10 MPa or higher, there is a tendency that the non-adhesive layer is not easily softened in a process in which heat is applied, such as a wire bonding process, and the non-adhesive layer does not easily adhere to a mold and jigs. The elastic modulus at 230° C. of the non-adhesive layer may be 2,000 MPa or less, and may be 1,800 MPa or less.

The elastic modulus at 230° C. of the non-adhesive layer can be measured similarly to the elastic modulus at 230° C. of the adhesive layer as described above.

The adhesive force of the non-adhesive layer to a mold and jigs is not particularly limited as long as the adhesive force is low to the extent that the non-adhesive layer does not adhere to the mold and/or jigs during a process; however, the peel strength at a peeling angle of 90 degrees between the non-adhesive layer and the mold as well as jigs at normal temperature (for example, 25° C.) may be less than 5 N/m, or may be 1 N/m or less. This peel strength is measured, for example, after the non-adhesive layer is pressure-bonded to a mold made of brass at a temperature of 250° C. and a pressure of 8 MPa for 10 seconds.

The glass transition temperature of the non-adhesive layer may be 150° C. or higher, may be 200° C. or higher, or may be 250° C. or higher, in order to make the non-adhesive layer difficult to be softened in a process of adhering a semiconductor element to a die pad, a wire bonding process, a sealing process, a process of tearing off the temporary protective film from a sealing molded body, and the like, and to make it difficult for the non-adhesive layer to be attached to a mold and jigs. The glass transition temperature of the non-adhesive layer may be 350° C. or lower, or may be 300° C. or lower.

The composition of the resin used for the formation of the non-adhesive layer (hereinafter, also referred to as "resin (b)") is not particularly limited; however, for example, a thermoplastic resin and a thermosetting resin can all be used. The composition of the thermoplastic resin is not particularly limited; however, a thermoplastic resin having an amide group, an ester group, an imide group, or an ether group, similar to the resin described above, is desirable. Particularly, the thermoplastic resin may be an aromatic polyether amideimide obtainable by reacting 1 mol of the basic component (3) with 0.95 to 1.05 mol, or 0.98 to 1.02 mol, of the acid component (A). The composition of the thermosetting resin is not particularly limited; however, for example, the thermosetting resin may be an epoxy resin, a phenolic resin, or a bismaleimide resin (for example, a bismaleimide resin produced using bis(4-maleimidophenyl) methanol as a monomer). It is also acceptable to use a thermoplastic resin and a thermosetting resin as a mixture. In the case of using a thermoplastic resin and a thermosetting resin in combination, the thermosetting resin may be used in an amount of 5 to 100 parts by mass, or may be used in an amount of 20 to 70 parts by mass, with respect to 100 parts by mass of the thermoplastic resin.

The non-adhesive layer may contain other components in addition to the resin (b). Examples of the other components include the filler and the coupling agent described above. In a case in which the non-adhesive layer contains a filler as another component, the content of the filler may be 1 to 30 parts by mass, or may be 5 to 15 parts by mass, with respect to 100 parts by mass of the resin (b). In a case in which the non-adhesive layer contains a coupling agent as another component, the content of the coupling agent may be 1 to 20 parts by mass, or may be 5 to 15 parts by mass, with respect to 100 parts by mass of the resin (b).

The method of forming a non-adhesive layer on a support film is not particularly limited; however, usually, a non-adhesive layer can be formed by applying a varnish for forming a non-adhesive layer (resin varnish), which is produced by dissolving the resin (b) in a solvent such as N-methyl-2-pyrrolidone, dimethylacetamide, diethylene glycol dimethyl ether, tetrahydrofuran, cyclohexanone, methyl ethyl ketone, or dimethylformamide, on a support film and then heat-treating the varnish to remove the solvent. A non-adhesive layer containing a resin (b) can also be formed by applying on a support film a precursor varnish produced by dissolving a precursor (for example, polyamic acid) of the resin (b) (for example, a polyimide resin), which becomes the resin (b) (for example, a heat-resistant resin) by a heating treatment after varnish application or the like, in a solvent, and then heat-treating the varnish. In this case, as a result of the heating treatment after application of the precursor varnish, the solvent is removed, and at the same time, the precursor of the resin (b) becomes the resin (b) (for example, imidization). From the viewpoint of the surface state of the coated surface, a resin varnish may also be used.

The treatment temperature in the case of heat-treating the support film coated with the varnish described above for the purpose of solvent removal, imidization, and the like, may differ depending on whether a resin varnish is used or a precursor varnish is used. The treatment temperature may be, in the case of a resin varnish, a temperature at which the solvent can be removed, and in the case of a precursor varnish, the treatment temperature may be higher than or equal to the glass transition temperature of the resin layer in order to achieve imidization.

In the case of using a thermosetting resin as the resin (b), or in the case of using a thermoplastic resin and a thermosetting resin in combination, the thermosetting resin is cured by a heating treatment after application, and thereby the elastic modulus of the non-adhesive layer can be adjusted to 10 MPa or higher. This heating treatment can be carried out simultaneously with solvent removal and/or imidization, or can be carried out separately.

In a case in which the non-adhesive layer is provided on a surface of the support film, the surface being on the opposite side of the surface provided with the adhesive layer, curl of the temporary protective film attributed to volume reduction of the adhesive layer is offset by volume reduction of the non-adhesive layer at the time of solvent removal, imidization, and shrinkage at the time of curing of the thermosetting resin, or the like.

The method of applying a resin varnish containing the resin (b) or a precursor varnish containing a precursor of the resin (b) on a support film is not particularly limited; however, the application can be carried out using, for example, roll coating, reverse roll coating, gravure coating, bar coating, comma coating, die coating, or pressure reduction die coating.

The thickness of the non-adhesive layer may be, for example, 10 μm or less, 9 μm or less, 8 μm or less, or 7 μm or less. The thickness of the non-adhesive layer may be, for example, 1 μm or more, 2 μm or more, 3 μm or more, 4 μm or more, 5 μm or more, or 6 μm or more. The thickness of the non-adhesive layer is not particularly limited; however, the thickness may be, for example, 1 to 10 μm, or 1 to 8 μm.

The ratio (A/C) of the thickness of the adhesive layer (A) to the thickness of the non-adhesive layer (C) may be 1.0 to 2.0, or 1.3 to 2.0.

<Support Film>

The support film is not particularly limited; however, the support film may be a film formed from a resin that can endure heat during application and drying of a resin that is used for forming an adhesive layer or a non-adhesive layer, and during a semiconductor device assembly process (heat-resistant resin). The support film may be, for example, a film of at least one polymer selected from the group consisting of an aromatic polyimide, an aromatic polyamide, an aromatic polyamideimide, an aromatic polysulfone, an aromatic polyethersulfone, a polyphenylene sulfide, an aromatic polyether ketone, a polyallylate, an aromatic polyether ether ketone, and polyethylene naphthalate.

The glass transition temperature of the support film may be 200° C. or higher, or may be 250° C. or higher, in order to increase heat-resistance. By using a film of the above-described polymers, in processes of applying heat, such as a process of adhering a semiconductor element to a die pad, a wire bonding process, a sealing process, and a process of tearing off the temporary protective film from a sealing molded body, the support film is not softened, and the operation can be carried out efficiently.

It is preferable that the support film has sufficiently high adhesiveness to the adhesive layer. When the adhesiveness is low; at the time of tearing off the support film from the lead frame and the sealing material at a temperature of 100° C. to 300° C., detachment is likely to occur at the interface between the adhesive layer 2 and the support film, and the resin is likely to remain on the lead frame and the sealing material. Since it is preferable that the support film has heat resistance and sufficiently high adhesiveness to the adhesive layer, the support film may be a polyimide.

The type of the polyimide film is not particularly limited; however, the coefficient of linear expansion at 30° C. to 200° C. may be $3.0 \times 10^{-5}/°$ C. or less, may be $2.5 \times 10^{-5}/°$ C. or less, or may be $2.0 \times 10^{-5}/°$ C. or less. The heat shrinkage factor obtainable at the time of heating for 2 hours at 200° C. may be 0.15% or less, may be 0.1% or less, and may be 0.05% or less.

Regarding the support film, the surface may be treated in order to sufficiently increase tight adhesiveness to the adhesive layer. The method for surface-treating the support film is not particularly limited; however, examples include chemical treatments such as an alkali treatment and a silane coupling treatment; physical treatments such as a sand mat treatment; a plasma treatment, a corona treatment, and the like.

The thickness of the support film is not particularly limited; however, in order to reduce warpage of the lead frame after the temporary protective film is attached to the lead frame, the thickness may be 100 μm or less, may be 50 μm or less, and may be 25 μm or less. The thickness of the support film may be 5 μm or more, and may be 10 μm or more.

The material of the support film can also be selected from the group consisting of copper, aluminum, stainless steel, and nickel, in addition to the resins described above. By making the support film from a metal, the coefficients of linear expansion of the lead frame and the support film can be made closer, and warpage of the lead frame after the temporary protective film has been attached to the lead frame can be reduced.

In the case of a temporary protective film in which an adhesive layer is provided on one surface of a support film, from the viewpoint that curl of the film caused by volume reduction of the adhesive layer at the time of solvent removal after application is more easily suppressed, the ratio (A/B) of the thickness of the adhesive layer (A) to the thickness of the support film (B) may be 0.2 or less, may be 0.1 or less, and may be 0.05 or less. In a case in which the ratio (A/B) of the thickness of the adhesive layer (A) to the thickness of the support film (B) is 0.2 or less, there is a tendency that curl of the film caused by volume reduction of the resin layer at the time of solvent removal after application is easily suppressed, and decrease in workability, productivity, and the like at the time of adhering the film to the lead frame is easily suppressed.

From the viewpoint that curl of the temporary protective film is more easily suppressed, in the temporary protective film, an adhesive layer may be provided on both surfaces of a support film, or a non-adhesive layer may be provided on a surface of a support film, the surface being on the opposite side of the surface provided with the adhesive layer. In the case of a temporary protective film having a three-layer structure having an adhesive layer provided on both surfaces of a support film, the thickness of the adhesive layer (A) described above means the thickness of any one layer of the adhesive layer. In this case, the ratio (A/A) of the thicknesses (A) of the adhesive layers is desirably 1.

<Cover Film>

The temporary protective film for semiconductor sealing molding may include a cover film provided on a surface of the adhesive layer, the surface being on the opposite side of the surface provided with the support film. That is, the temporary protective film for semiconductor sealing molding may be in the form of a cover film-attached temporary protective film for semiconductor sealing molding. The cover film is not particularly limited; however, the cover film may be a polyethylene terephthalate film or may be a polyethylene terephthalate film provided with a release layer.

The thickness of the cover film may be 10 μm or more, may be 20 μm or more, and may be 100 μm or less.

<Method for Producing Semiconductor Device>

A semiconductor device can be produced by a method including a sealing molding process of a semiconductor element using the temporary protective film according to an embodiment. The semiconductor device thus produced may be, for example, a Non Lead Type Package, which has a lead frame and a semiconductor element mounted thereon; and a sealing layer sealing the semiconductor element on the semiconductor element-side of the lead frame, with the rear surface of the lead frame being exposed for external connection. Specific examples thereof include QuadFlat Non-leaded Package (QFN) and Small Outline Non-leaded Package (SON).

Figure 3:
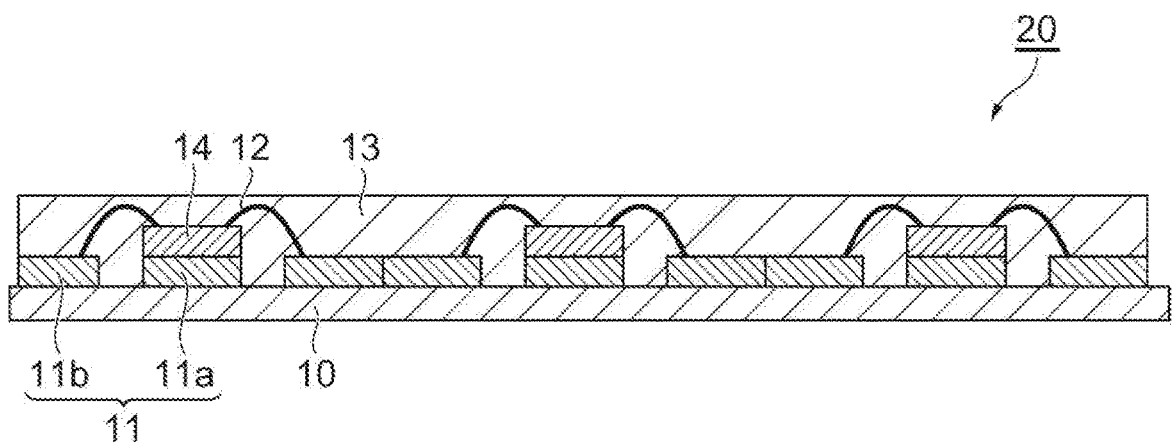
FIG. 3 is a cross-sectional view explaining an embodiment of a method for producing a semiconductor device.

FIG. 3 is a cross-sectional view illustrating a method for producing a semiconductor device according to an embodiment. FIG. is a cross-sectional view illustrating an embodiment of a semiconductor device obtainable according to the production method of FIG. 3. Hereinafter, various processes will be explained with reference to the various drawings as necessary.

The method for producing a semiconductor device according to the embodiment of FIG. 3 includes, in the following order: a step of attaching a temporary protective film 10 (or 10') on one surface (rear surface) of a lead frame 11 having a die pad and an inner lead 11b, in a direction in which an adhesive layer of the temporary protective film comes into contact with the lead frame, and an in-plane direction of the temporary protective film 10 (or 10'), in which the coefficient of linear expansion at 30° C. to 200° C. is higher than or equal to 16 ppm/° C. and lower than or equal to 20 ppm/° C., runs parallel to a shorter side in a case where the outer periphery of the lead frame is a rectangular shape, and parallel to any one side in a case where the outer periphery of the lead frame has a square shape; a step of mounting (adhering) a semiconductor element 14 on a surface of the die pad 11a, the surface being on the opposite side of the temporary protective film 10 (or 10'); a step of providing a wire 12 for connecting the semiconductor element 14 and the inner lead 11b; a step of forming a sealing layer 13 for covering the semiconductor element 14 side surface of the lead frame 11, the semiconductor element 14, and the wire 12, and thereby sealing the semiconductor element 14; a step of obtaining a sealing molded body 20 having the temporary protective film 10 (or 10'), the lead frame 11, the semiconductor element 14, and a sealing layer 13; and a step of peeling off the temporary protective film 10 (or 10') from the sealing molded body 20.

The conditions for attaching the temporary protective film 10 (or 10') to the lead frame 11 are not particularly limited; however, the adhesion temperature may be 150° C. or higher, may be 180° C. or higher, and may be 200° C. or higher. The adhesion temperature may be 400° C. or lower, may be 350° C. or lower, and may be 300° C. or lower. In a case in which the adhesion temperature is 150° C. or higher, the peel strength at a peeling angle of 90 degrees between the lead frame and the resin layer 2 tends to further increase. In a case in which the adhesion temperature is 400° C. or lower, deterioration of the lead frame tends to be further suppressed.

The adhesion pressure of the temporary protective film 10 (or 10') to the lead frame 11 may be 0.5 MPa or higher, may be 1 MPa or higher, and may be 3 MPa or higher. The adhesion pressure may be 30 MPa or lower, may be 20 MPa or lower, and may be 15 MPa or lower, and in a case in which the adhesion pressure is 0.5 MPa or higher, the peel strength at a peeling angle of 90 degrees between the adhesive layer and the lead frame tends to further increase. In a case in which the adhesion pressure is 30 MPa or lower, damage of the lead frame tends to be suppressed more easily. According to the present invention, the time for adhesion of the temporary protective film to the lead frame may be between 0.1 seconds and 60 seconds, may be 1 to 30 seconds, and may be 3 to 20 seconds. In a case in which the adhesion time is 0.1 seconds or longer, the 90-degree peel strength between the adhesive layer and the lead frame tends to be increased more easily. In a case in which the adhesion time is 60 seconds or shorter, workability and productivity tend to be enhanced more easily. Before pressure is applied, preliminary heating may be carried out for about 5 to 60 seconds.

The temporary protective film-attached lead frame according to an embodiment includes a lead frame 11 having a die pad 11a and an inner lead 11b; and a temporary protective film 10 (or 10'), and the temporary protective film 10 (or 10') is attached to the lead frame 11 in a direction in which the adhesive layer 2 of the temporary protective film comes into contact with one surface of the lead frame 11, and an in-plane direction of the temporary protective film 10 (or 10'), in which the coefficient of linear expansion at 30° C. to 200° C. is higher than or equal to 16 ppm/° C. and lower than or equal to 20 ppm/° C., runs parallel to a shorter side of the lead frame in a case where the outer periphery of the lead frame 11 has a rectangular shape, and parallel to any one side in a case where the outer periphery of the lead frame 11 has a square shape.

The material for the lead frame 11 is not particularly limited; however, for example, the material may be an iron-based alloy such as Alloy 42, copper, or a copper-based alloy. In the case of using a lead frame of copper and a copper-based alloy, the surface of the lead frame may be subjected to a coating treatment with palladium, gold, silver, or the like. In order to enhance the adhesive force to the sealing material, the lead frame surface may be subjected to a physical roughening treatment. A chemical treatment such as an epoxy bleed-out (EBO) prevention treatment of preventing bleed-out of a silver paste may be applied to the lead frame surface. The thickness of the lead frame may be, for example, 30 to 150 μm. When the thickness of the lead frame is in this range, warpage of the lead frame tends to occur easily after the temporary protective film used for semiconductor sealing molding is attached to the lead frame; however, when the temporary protective film according to the present embodiment is used, the occurrence of warpage of the lead frame is suppressed.

The semiconductor element 14 is usually adhered to the die pad 11a by means of an adhesive (for example, a silver paste). The adhesive may be cured by means of a heating treatment (for example, 140'C to 200° C., 30 minutes to 2 hours).

The length in the extension direction of the die pad 11a and/or the length in a direction orthogonally intersecting the extension direction may be 5 μm or less, 3 μm or less, 2 μm or less, or 1 μm or less. When the above-mentioned length of the die pad 11a becomes smaller, warpage of the lead frame is likely to occur after the temporary protective film is attached to the lead frame. When the temporary protective film according to the present embodiment is used, even in a case in which a die pad 11a having the above-mentioned length is used, the occurrence of warpage of the lead frame is suppressed.

The wire 12 is not particularly limited; however, for example, the wire may be a gold wire, a copper wire, or a palladium-coated copper wire. For example, the semiconductor element and the inner lead may be joined with a wire 12 by heating for 3 to 60 minutes at 200° C. to 270° C. and utilizing ultrasonic waves and pressing pressure.

After wire bonding using the wire 12, and before a process of sealing molding for obtaining a sealing molded body 20 (forming a sealing layer 13), the lead frame 11 may be subjected to a plasma treatment. Through a plasma treatment, the adhesiveness between the sealing layer and the lead frame can be further increased, and the reliability of the semiconductor device can be further increased. Regarding the plasma treatment, for example, a method of injecting a gas such as argon, nitrogen, or oxygen at a predetermined gas flow rate under reduced pressure conditions (for example, 9.33 Pa or less) and radiating plasma may be mentioned. The output power for plasma radiation in the plasma treatment may be, for example, 10 to 500 W. The time for the plasma treatment may be, for example, 5 to 50 seconds. The gas flow rate in the plasma treatment may be 5 to 50 sccm.

In the process for sealing molding, the sealing layer 13 is formed using a sealing material. Through sealing molding, a sealing molded body 20 having a plurality of semiconductor elements 14 and a sealing layer 13 integrally sealing those, is obtained. During the sealing molding, since the temporary protective film 10 (or 10') is provided, the sealing material is prevented from wrapping around the rear surface side of the lead frame 11.

A temporary protective film-attached sealing molded body according to an embodiment includes a lead frame 11 having a die pad 11a and an inner lead 11b; a semiconductor element 14 mounted on the die pad 11a; a wire 12 connecting the semiconductor element 14 and the inner lead 11b; a sealing layer 13 sealing the semiconductor element 14 and the wire 12; and a temporary protective film. 10 (or 10'), and in the temporary protective film 10 (or 10'), the adhesive layer 2 thereof is attached to a surface of the lead frame 11, the surface being on the opposite side of the surface where the semiconductor element 14 is mounted.

The temperature during the formation of the sealing layer (sealing temperature) may be 140° C. to 200° C., or may be 160° C. to 180° C. The pressure during the formation of the sealing layer (sealing pressure) may be 6 to 15 MPa, or may be 7 to 10 MPa. The heating time for sealing molding (sealing time) may be 1 to 5 minutes, or may be 2 to 3 minutes.

The sealing layer 13 thus formed may be heated and cured as necessary. The heating temperature for curing of the sealing layer (sealing curing temperature) may be 150° C. to 200° C., or may be 160° C. to 180° C. The heating time for curing of the sealing layer (sealing curing time) may be 4 to 7 hours, or may be 5 to 6 hours.

The material for the sealing material is not particularly limited; however, examples include epoxy resins such as a cresol novolac epoxy resin, a phenol novolac epoxy resin, a biphenyl diepoxy resin, and a naphthol novolac epoxy resin. In the sealing material, for example, additive materials such as a filler, a flame retardant substance such as a bromine compound, and a wax component may be incorporated.

After the formation of the sealing layer 13 (sealing molding), the temporary protective film 10 (or 10') is peeled off from the lead frame 11 and the sealing layer 13 of the sealing molded body 20. In the case of curing the sealing layer, the temporary protective film 10 (or 10') may be peeled off at any time point before or after curing of the sealing layer.

The temperature at the time of peeling off the temporary protective film is not particularly limited; however, the peeling temperature may be between 0° C. and 250° C. In a case in which the temperature is 0° C. or higher, it is difficult for the adhesive layer to remain on the lead frame and the sealing material. When the temperature is 250° C. or lower, deterioration of the lead frame and the sealing material tends to be suppressed. From the reasons such as described above, the peeling temperature may be 100° C. to 250° C., and may be 150° C. to 200° C.

The method for producing a semiconductor device may further include, if necessary, a step of removing the adhesive layer (adhesive residue) remaining on the lead frame 11 and the sealing layer 13 after the peeling step. According to the present invention, it is preferable that when the temporary protective film is torn off at 0° C. to 250° C. after sealing with a sealing material, the adhesive layer does not remain on the lead frame and the sealing material. In a case in which the residual amount of the adhesive layer is large, the external appearance becomes poor, and also, when the lead frame is used for external connection, the adhesive residue easily causes defective plating or defective contact. Therefore, the adhesive layer remaining on the lead frame and the sealing material may be removed using a mechanical brushing, a solvent, or the like. The solvent is not particularly limited; however, N-methyl-2-pyrrolidone, dimethylacetamide, diethylene glycol dimethyl ether, tetrahydrofuran, cyclohexanone, methyl ethyl ketone, dimethylformamide, and the like are used.

Figure 4:
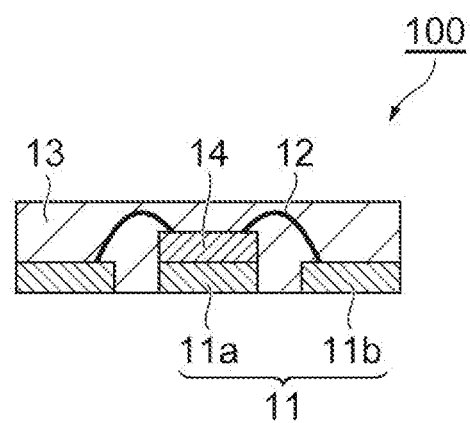
FIG. 4 is a cross-sectional view illustrating an embodiment of a semi conductor device.

In a case in which the lead frame includes a plurality of patterns each having a die pad and an inner lead, if necessary, a plurality of the semiconductor device 100 of FIG. 4 each having one semiconductor element can be obtained by dividing the sealing molded body 20.

That is, in a case in which the lead frame 11 has a plurality of die pads 11a, and a semiconductor element 14 is mounted on each of the multiple die pads 11a, the production method according to the embodiment may further include a step of dividing the sealing molded body 20 before or after the temporary protective film 10 (or 10' from the sealing molded body 20, and thereby obtaining semiconductor devices 100 each having one die pad 11a and semiconductor element 14.

A semiconductor device may be produced while a temporary protective film is unwound from the reel body obtained by winding a long temporary protective film around a winding core. The reel body in this case has a winding core and a temporary protective film wound around the winding core according to the above-described embodiment.

Figure 6:
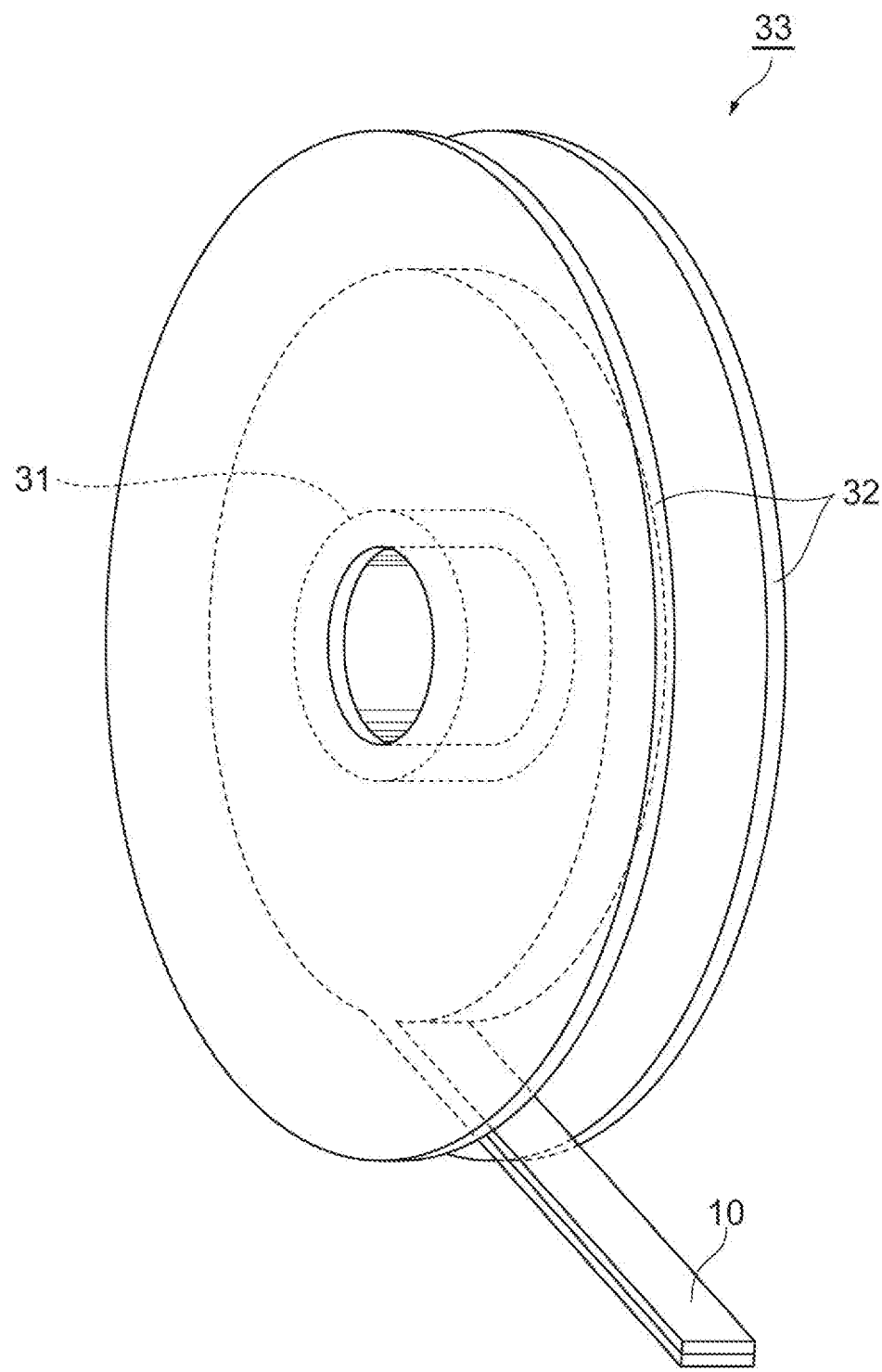
FIG. 6 is a perspective view illustrating an embodiment of a reel body.

FIG. 6 is a perspective view illustrating an embodiment of a reel body. The reel body 33 illustrated in FIG. 6 includes a winding core 31, a temporary protective film 10 wound around the winding core 31, and side plates 32.

The width (length in a direction orthogonally intersecting the direction of winding) of the winding core 31 and the temporary protective film 10 may be, for example, 1.0 μm or more, 50 μm or more, 50 μm or more, or 80 μm or more, and may be 300 μm or less. The width (length in a direction orthogonally intersecting the direction of winding) of the winding core 31 and the temporary protective film 10 may be, for example, more than or equal to 10 μm and less than or equal to 300 μm, more than or equal to 50 μm and less than or equal to 300 μm, or more than or equal to 80 μm and less than or equal to 300 μm.

Figure 7:
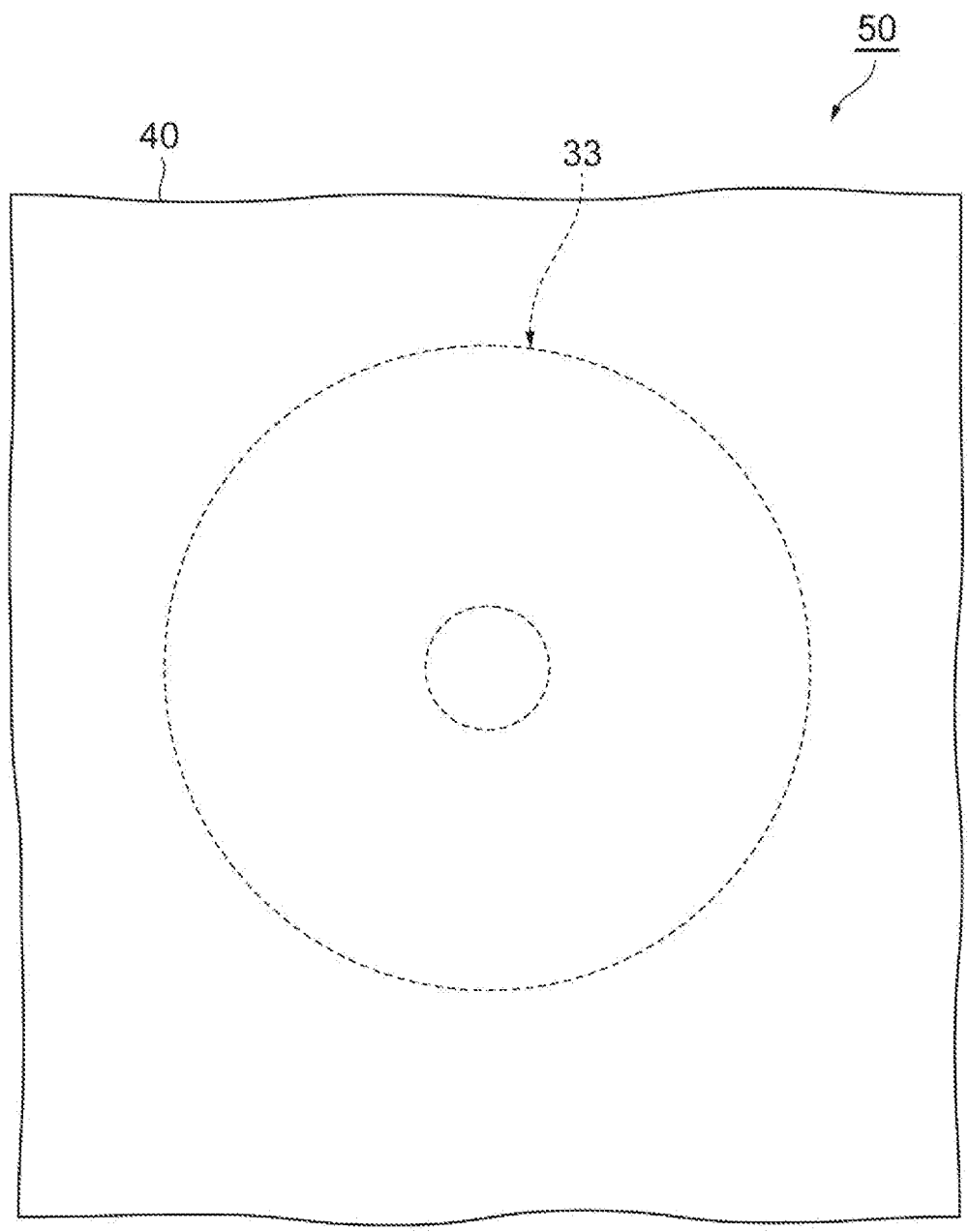
FIG. 7 is a front view diagram illustrating an embodiment of a package.

The temporary protective film according to the above-described embodiments may be supplied as a package in which the above-described reel body is accommodated in a packaging bag. FIG. 7 illustrates an embodiment of the package. As illustrated in FIG. 7, the package 50 includes the reel body 33 and a packaging bag 40 accommodating the reel body 33. The reel body 33 is usually individually accommodated in a packaging bag; however, a plurality of (for example, two or three) the reel bodies 33 may be accommodated in one packaging bag 40.

The packaging bag 40 may be formed from a resin film, or may be formed from a composite film, which is a resin film having an aluminum layer. A specific example of the packaging bag 40 may be an aluminum-coated plastic bag, or the like. Examples of the material of the resin film include plastics such as polyethylene, polyester, vinyl chloride, and polyethylene terephthalate. The reel body 33 may be, for example, accommodated in a packaging bag in a vacuum-packed state. The package 50 is not limited to a vacuum-packed product.

In the packaging bag 40, a desiccant may be accommodated together with the reel body 33. Examples of the desiccant include silica gel. The package 50 may be a product in which the packaging bag 40 accommodating the reel body 33 is further wrapped with a cushioning material.

Figure 8:
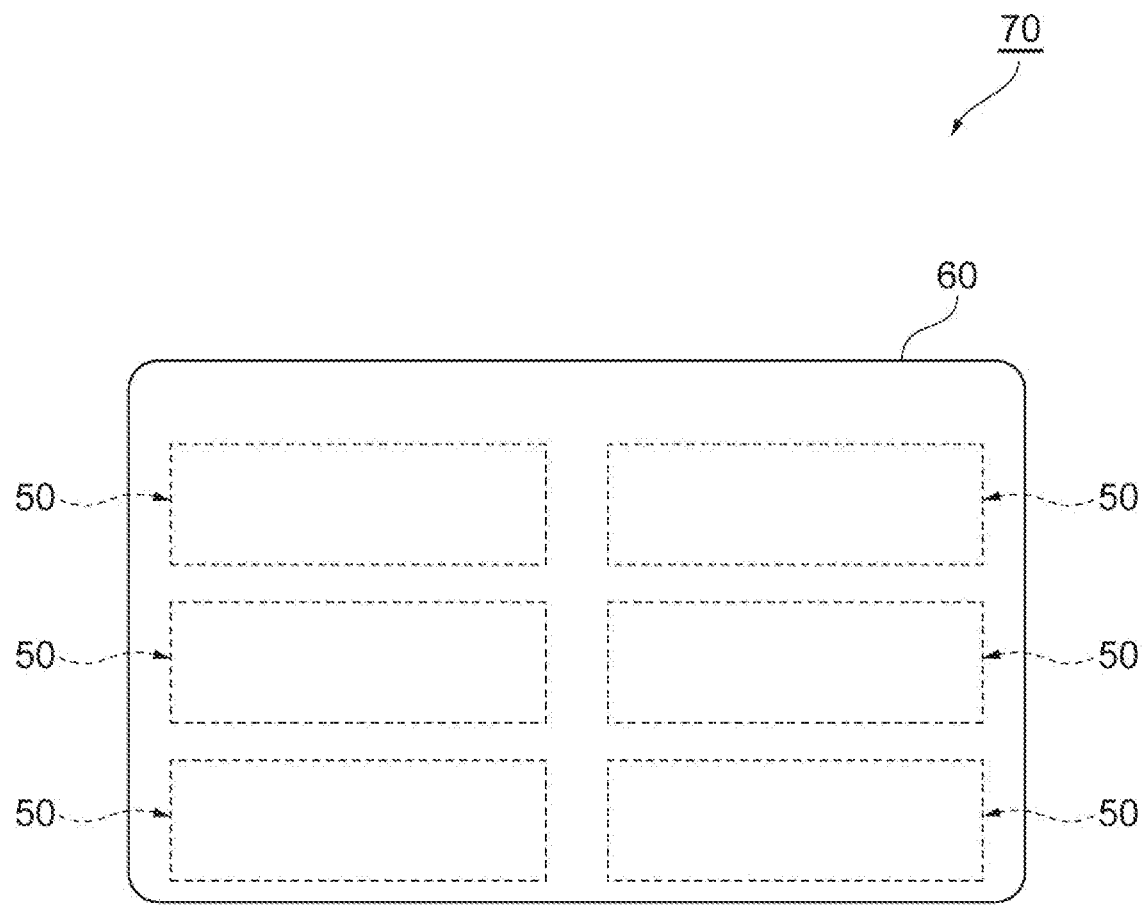
FIG. 8 is a front view diagram illustrating an embodiment of a packing material.

The package 50 may be supplied as a packing material accommodated in a packing box FIG. 8 illustrates an embodiment of the packing material. As illustrated in FIG. 8, the packing material 70 includes the package 50 and a packing box 60 accommodating the package 50. In the packing box 60, one or a plurality of packages 50 are accommodated. As the packing box 60, for example, corrugated cardboard can be used.

The semiconductor device produced using the temporary protective film according to an embodiment is excellent in view of density increase, area reduction, thickness reduction, and the like, and can be suitably utilized in electronic instruments such as, for example, mobile telephones, smart phones, personal computers, and tablets.

Examples

Hereinafter, the present invention will be explained more specifically by way of Examples; however, the present invention is not intended to be limited to the following Examples.

Production of Temporary Protective Films of Examples 1 to 15 and Comparative Examples 1 to 4

(Production of Coating Varnish)

Production Example 1: Production of Varnish 1 for Adhesive Layer Formation

In a 5-liter four-necked flask equipped with a thermometer, a stirrer, a nitrogen inlet tube, and a fractionating column, 258.3 g (0.63 mol) of 2,2-bis[4-(4-aminophenoxy)phenyl]propane and 10.4 g (0.042 mol) of 1,3-bis(3-aminopropyl)-tetramethyldisiloxane were introduced in a nitrogen atmosphere, and these were dissolved in 1,450 g of N-methyl-2-pyrrolidone. Furthermore, this solution was heated to 70° C., and 33.6 g (0.168 mol) of 1,12-diaminododecane was added thereto and dissolved at this temperature. Furthermore, this solution was cooled to 0° C., and 180.4 g (0.857 mol) of trimellitic anhydride chloride was added thereto at this temperature. After trimellitic anhydride chloride had dissolved, 130 g of triethylamine was added thereto. Stirring was continued for 2 hours at room temperature, subsequently the temperature was increased to 180° C., and imidization was completed by a reaction for 5 hours. The reaction liquid was introduced into methanol, and a polymer was isolated. This was dried and then was dissolved in N-methyl-2-pyrrolidone. The solution was introduced into methanol, and the polymer was isolated again. The polymer thus isolated was dried under reduced pressure, and thereby purified polyether amideimide in a powder form was obtained, 120 g of this polyether amideimide and 6 g of a silane coupling agent (manufactured by Dow Corning Toray Co., Ltd., trade name: S116040) were dissolved in 360 g of N-methyl-2-pyrrolidone, and varnish 1 for adhesive layer formation was obtained.

Production Example 2: Production of Varnish 2 for Adhesive Layer Formation

In a 5-liter four-necked flask equipped with a thermometer, a stirrer, a nitrogen inlet tube, and a fractionating column, 258.6 g (0.63 mol) of 2,2-bis[4-(4-aminophenoxy)phenyl]propane and 67.0 g (0.27 mol) of 1,3-bis(3-aminopropyl)-tetramethyldisiloxane were introduced in a nitrogen atmosphere, and these were dissolved in 1,550 g of N-methyl-2-pyrrolidone. Furthermore, this solution was cooled to 0° C., and 187.3 g (0.89 mol) of trimellitic anhydride chloride was added thereto at this temperature. After trimellitic anhydride chloride dissolved, 100 g of triethylamine was added thereto. Stirring was continued for 2 hours at room temperature, subsequently the temperature was increased to 180° C., and imidization was completed by a reaction for 5 hours. The reaction liquid was introduced into methanol, and a polymer was isolated. This was dried and then was dissolved in N-methyl-2-pyrrolidone. The solution was introduced into methanol, and the polymer was isolated again. The polymer thus isolated was dried under reduced pressure, and thereby a purified polyether amideimide in a powder form was obtained. 120 g of this polyether amideimide and 3.6 g of a silane coupling agent (manufactured by Dow Corning Toray Co., Ltd., trade name: SH6040) were dissolved in 360 g of N-methyl-2-pyrrolidone, and varnish 2 for adhesive layer formation was obtained.

Production Example 3: Production of Varnish 3 for Non-Adhesive Layer Formation

In a 5-liter four-necked flask equipped with a thermometer, a stirrer, a nitrogen inlet tube, and a fractionating column, 172.4 g (0.42 mol) of 2,2-bis[4-(4-aminophenoxy)phenyl]propane and 153.7 g (0.42 mol) of 4,4'-methylenebis(2,6-diisopropylaniline) were introduced in a nitrogen atmosphere, and these were dissolved in 1,550 g of N-methyl-2-pyrrolidone. Furthermore, this solution was cooled to 0° C., and 174.7 g (0.83 mol) of trimellitic anhydride chloride was added thereto at this temperature. After trimellitic anhydride chloride dissolved, 130 g of triethylamine was added thereto. Stirring was continued for 2 hours at room temperature, subsequently the temperature was increased to 180° C., and imidization was completed by a reaction for 5 hours. The reaction liquid was introduced into methanol, and a polymer was isolated. This was dried and then was dissolved in N-methyl-2-pyrrolidone. The solution was introduced into methanol, and the polymer was isolated again. The polymer thus isolated was dried under reduced pressure, and thereby purified polyether amideimide in a powder form was obtained. 120 g of this polyether amideimide and 6 g of a silane coupling agent (manufactured by Dow Corning Toray Co., Ltd., trade name: SH6040) were dissolved in 360 g of N-methyl-2-pyrrolidone, and varnish 3 for non-adhesive layer formation was obtained.

Production Example 4: Production of Varnish 4 for Adhesive Layer Formation

In a 5-liter four-necked flask equipped with a thermometer, a stirrer, a nitrogen inlet tube, and a fractionating column, 270.9 g (0.66 mol) of 2,2-bis[4-(4-aminophenoxy)phenyl]propane and 8.7 g (0.035 mol) of 1,3-bis(3-aminopropyl)-tetramethyldisiloxane were introduced in a nitrogen atmosphere, and these were dissolved in 1,950 g of N-methyl-2-pyrrolidone. Furthermore, this solution was cooled to 0° C., and 149.5 g (0.71 mol) of trimellitic anhydride chloride was added thereto at this temperature. After trimellitic anhydride chloride dissolved, 100 g of triethylamine was added thereto. Stirring was continued for 2 hours at room temperature, subsequently the temperature was increased to 180° C., and imidization was completed by a reaction for 5 hours. The reaction liquid was introduced into methanol, and a polymer was isolated. This was dried and then was dissolved in N-methyl-2-pyrrolidone. The solution was introduced into methanol, and the polymer was isolated again. The polymer thus isolated was dried under reduced pressure, and thereby a purified polyether amideimide in a powder form was obtained. 120 g of this polyether amideimide and 3.6 g of a silane coupling agent (manufactured by Dow Corning Toray Co., Ltd., trade name: S116040) were dissolved in 360 g of N-methyl-2-pyrrolidone, and varnish 4 for adhesive layer formation was obtained.

Production Example 5: Production of Varnish 5 for Adhesive Layer Formation

In a 5-liter four-necked flask equipped with a thermometer, a stirrer, a nitrogen inlet tube, and a fractionating column, 102.5 g (0.25 mol) of 2,2-bis[4-(4-aminophenoxy)phenyl]propane and 91.5 g (0.25 mol) of 4,4-methylenebis(2,6-diisopropylaniline) were introduced in a nitrogen atmosphere, and these were dissolved in 1,900 g of N-methyl-2-pyrrolidone. Furthermore, this solution was cooled to 0° C., and 282.2 g (0.49 mol) of bisphenol A bistrimellitate dianhydride was added thereto at this temperature. Thereafter, stirring was continued for 20 minutes at room temperature and for 2 hours at 60° C., subsequently the temperature was increased to 180° C., and imidization was completed by a reaction for 5 hours. The reaction liquid was introduced into methanol, and a polymer was isolated. This was dried and then was dissolved in N-methyl-2-pyrrolidone. The solution was introduced into methanol, and the polymer was isolated again. The polymer thus isolated was dried under reduced pressure, and thereby a purified polyether imide in a powder form was obtained. 120 g of this polyether imide was dissolved in 360 g of N-methyl-2-pyrrolidone, and varnish 5 for adhesive layer formation was obtained.

Production Example 6: Production of Varnish 6 for Adhesive Layer Formation

In a 5-liter four-necked flask equipped with a thermometer, a stiffer, a nitrogen inlet tube, and a fractionating column, 250.9 g (0.58 mol) of 2,2-bis[4-(4-aminophenoxy)phenyl]sulfone and 7.4 g (0.03 mol) of 1,3-bis(3-aminopropyl)-tetramethyldisiloxane were introduced in a nitrogen atmosphere, and these were dissolved in 1,500 g of N-methyl-2-pyrrolidone. Furthermore, this solution was cooled to 0° C., and 126.3 g (0.6 mol) of trimellitic anhydride chloride was added thereto at this temperature. After trimellitic anhydride chloride dissolved, 67 g of triethylamine was added thereto. Stirring was continued for 2 hours at room temperature, subsequently the temperature was increased to 180° C., and imidization was completed by a reaction for 5 hours. The reaction liquid was introduced into methanol, and a polymer was isolated. This was dried and then was dissolved in N-methyl-2-pyrrolidone. The solution was introduced into methanol, and the polymer was isolated again. The polymer thus isolated was dried under reduced pressure, and thereby a purified polyether amideimide in a powder form was obtained. 120 g of this polyether amideimide and 6.0 g of a silane coupling agent (manufactured by Dow Corning Toray Co., Ltd., trade name: SH6040) were dissolved in 360 g of N-methyl-2-pyrrolidone, and varnish 6 for adhesive layer formation was obtained.

Production Example 7: Production of Varnish 7 for Adhesive Layer Formation

In a 5-liter four-necked flask equipped with a thermometer, a stirrer, a nitrogen inlet tube, and a fractionating column, 295.2 g (0.72 mol) of 2,2-bis[4-(4-aminophenoxy)phenyl]sulfone and 540 g (0.18 mol) of siliconediamine (manufactured by Dow Corning Toray Co., Ltd., trade name: X-22-161B) were introduced in a nitrogen atmosphere, and these were dissolved in 2,400 g of diethylene glycol dimethyl ether. Furthermore, this solution was cooled to −10° C., and 188.8 g (0.93 mol) of isophthalic acid chloride was added thereto at this temperature. Thereafter, the mixture was stirred for 1 hour, and then 214 g of propylene oxide was added thereto. Furthermore, stirring was continued for 30 minutes at room temperature, subsequently the temperature was increased to 40° C., and a reaction was carried out for 5 hours. The reaction liquid was introduced into methanol, and a polymer was isolated. This was dried and then was dissolved in dimethylformamide. The solution was introduced into methanol, and the polymer was isolated again. The polymer thus isolated was dried under reduced pressure, and thereby a purified polysiloxane polyamide block copolymer in a powder form was obtained. 120 g of this polysiloxane polyamide block copolymer and 6.0 g of a silane coupling agent (manufactured by Dow Corning Toray Co., Ltd., trade name: SH6040) were dissolved in 360 g of N-methyl-2-pyrrolidone, and varnish 7 for adhesive layer formation was obtained.

(Production of Temporary Protective Film)

Examples 1 to 19

Varnish 1, 2, 4, 5, or 6 for adhesive layer formation was each applied on the support film indicated in Table 1. The coating film was dried by heating for 10 minutes at 100° C. and for 10 minutes at 300° C., and an adhesive layer having the thickness (film thickness) indicated in Table 1 was formed on the support film. EN100 and EN80 are trade names for polyimide films provided by DuPont de Nemours, Inc.; 25SGA is a trade name for a polyimide film provided by UBE Corporation. In a case in which a temporary protective film having a three-layer structure was produced, varnish 3 for non-adhesive layer formation was used, and similarly as described above, a non-adhesive layer having the thickness (film thickness) indicated in Table 1 was formed on a surface of the support film, the surface being on the opposite side of the adhesive layer. By the above-described method, temporary protective films of Examples 1 to 19 were formed.

Comparative Examples 1 to 9

Varnish 1, 2, 4, 5, 6, or 7 for adhesive layer formation was applied on the support film indicated in Table 2. 25SGA, 125SGA, and 50SGA are trade names for polyimide films provided by UBE Corporation. The coating film was dried by heating for 10 minutes at 100° C. and for 10 minutes at 300° C., and an adhesive layer having the thickness indicated in Table 2 was formed on the support film. In a case in which a temporary protective film having a three-layer structure was produced, varnish 3 for non-adhesive layer formation was used, and similarly as described above, a non-adhesive layer having the thickness indicated in Table 2 was formed on the support film. By the above-described method, temporary protective films of Comparative Examples 1 to 9 were obtained.

The Tg (° C.), the 5% weight reduction temperature (5% weight decomposition temperature) (° C.), and the elastic modulus at 230° C. (MPa, 230° C.) of the adhesive layers produced using varnishes 1, 2, and 4 to 7 were as described in Table 1. The Tg (° C.), the 5% weight reduction temperature (° C.), and the elastic modulus at 230° C. (MPa, 230° C.) of the non-adhesive layer produced using varnish 3 (Production Example 3) were 260° C., 421° C., and 1,700 MPa (230° C.), respectively.

<Evaluation>
(Measurement of Amount of Warpage)

A temporary protective film was cut out into a size of 220 mm×54 min and was subjected to tape prebaking at 250° C. for 10 seconds. This film was placed on a lead frame (manufactured by Shinko Electric Industries Co., Ltd., EL-D912S), and the film was thermally compressed using a pressing machine set to the conditions of 250° C. for the upper mold and 250° C. for the lower mold, under the conditions of 6 MPa and 12 seconds. In Example 5, thermal compression was performed under the conditions of an attachment temperature of 260° C.

Figure 5:
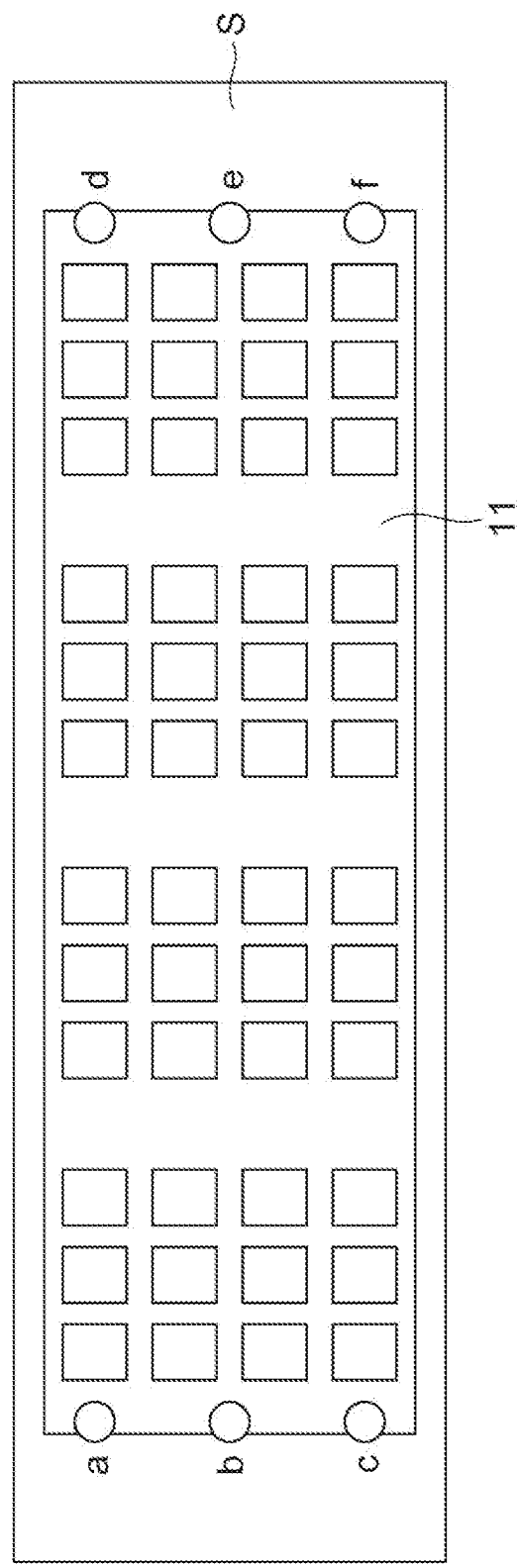
FIG. 5 is a schematic diagram for explaining a method of measuring the amount of warpage of a temporary protective film-attached lead frame.
Figure 5:
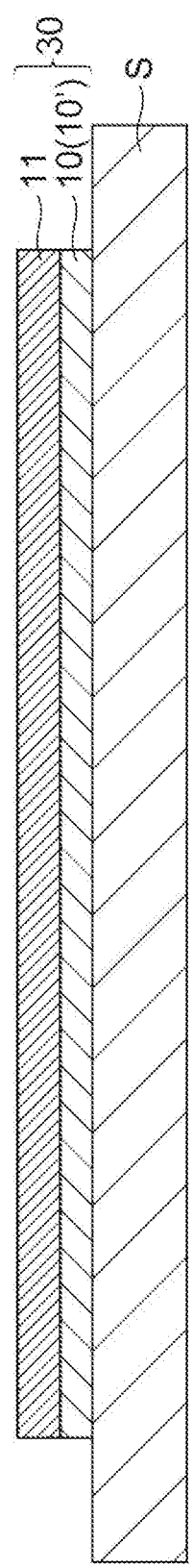

FIG. 5 is a schematic diagram for explaining a method for measuring the amount of warpage. As shown in FIG. 5B, a temporary protective film-attached lead frame 30 was placed on a measurement stage S in a direction in which the temporary protective film 10 (or 10') came into contact with the measurement stage S. Next, the height of the lower surface of the temporary protective film 10 (or 10') from the measurement stage S was measured at measurement points a to f of six sites provided along the edge on a shorter side of the outer periphery of the lead frame 11 shown in FIG. 5A. The amount of warpage was calculated by the following formula from the heights at the measurement points a to f.

Formula: Amount of warpage (μm)={(Maximum value of heights at a,b, and c)+(maximum value of heights at d,e, and f)}/2−100(film thickness of lead frame) (μm)−film thickness of temporary protective film (μm)

The amount of warpage was measured immediately after the attachment of the temporary protective film and after standing (after moisture absorption) for 24 hours under the conditions of 24° C. and 50% RH (relative humidity).

(Measurement of Tensile Modulus (Elastic Modulus))

A specimen obtained by cutting out a temporary protective film into a size of 4 mm×30 mm was mounted on a dynamic viscoelasticity measuring apparatus (manufactured by UBM Co., Ltd., Rheogel-E4000) at a distance between chucks of 20 mm. For the specimen thus mounted, the tensile modulus was measured with sinusoidal waves under the conditions of a temperature range maintained constant at 30° C. and a frequency of 10 Hz.

(Measurement of Coefficient of Linear Expansion (CTE))

A temporary protective film was left to stand for 10 minutes on a hot plate heated to 300° C., and thus the residual stress of the temporary protective film was eliminated. Thereafter, the temporary protective film was cut out into a size of 3 mm×30 mm such that the Transverse direction (TD) direction of the support film would be the longitudinal direction, and thus a specimen was obtained. The specimen was mounted on a thermomechanical analyzer (manufactured by Seiko Instruments, Inc., Model SSC5200) in a tensile mode at a distance between chucks of 20 mm. The specimen thus mounted was treated under the conditions of a temperature range of 30° C. to 300° C. and a rate of temperature increase of 10° C./min, and the coefficient of linear expansion of the specimen was measured. From the measurement results, the coefficient of linear expansion (CTE) at 30° C. to 200° C. was read out.

TABLE 1

| | Support film | | Adhesive layer | | | | | | |
|---|---|---|---|---|---|---|---|---|---|
| Example | Product name | Film thickness (μm) | Varnish | Film thickness (μm) | Adhesive layer/ support film (thickness ratio) | Tg (° C.) | 5% weight reduction temperature (° C.) | Elastic modulus (MPa, 230° C.) | Non-adhesive layer Varnish |
| 1 | 100EN | 25 | 1 | 2 | 0.08 | 195 | 421 | 7 | — |
| 2 | 100EN | 25 | 2 | 2 | 0.08 | 187 | 429 | 5 | — |
| 3 | 100EN | 25 | 4 | 2 | 0.08 | 230 | 451 | 150 | — |
| 4 | 100EN | 25 | 5 | 2 | 0.08 | 240 | 410 | 300 | — |
| 5 | 100EN | 25 | 6 | 2 | 0.08 | 260 | 430 | 1500 | — |
| 6 | 80EN | 20 | 2 | 2 | 0.1 | 187 | 429 | 5 | — |
| 7 | 80EN | 20 | 2 | 3 | 0.15 | 187 | 429 | 5 | — |
| 8 | 80EN | 20 | 2 | 2 | 0.1 | 187 | 429 | 5 | 3 |
| 9 | 80EN | 20 | 2 | 1 | 0.05 | 187 | 429 | 5 | — |
| 10 | 80EN | 20 | 4 | 3 | 0.15 | 230 | 451 | 150 | 3 |
| 11 | 80EN | 20 | 2 | 3 | 0.15 | 187 | 429 | 5 | 3 |
| 12 | 100EN | 25 | 2 | 1 | 0.04 | 187 | 429 | 5 | — |
| 13 | 100EN | 25 | 2 | 3 | 0.12 | 187 | 429 | 5 | — |
| 14 | 100EN | 25 | 2 | 2 | 0.08 | 187 | 429 | 5 | 3 |
| 15 | 100EN | 25 | 2 | 3 | 0.12 | 187 | 429 | 5 | 3 |
| 16 | 25SGA | 25 | 4 | 6 | 0.24 | 230 | 451 | 150 | 3 |
| 17 | 25SGA | 25 | 4 | 8 | 0.32 | 230 | 451 | 150 | 3 |
| 18 | 25SGA | 25 | 2 | 8 | 0.32 | 187 | 429 | 5 | 3 |
| 19 | 25SGA | 25 | 2 | 6 | 0.24 | 187 | 429 | 5 | 3 |

TABLE 1-continued

| Example | Non-adhesive layer Film thickness (μm) | Adhesive layer/ non-adhesive layer (thickness ratio) | Warpage amount (μm) Immediately after attachment | Warpage amount (μm) After moisture absorption 24° C./ 50% RH/24 h | Elastic modulus (GPa) Temporary protective film (30° C.) | CTE (ppm/° C.) (TD direction) Temporary protective film | CTE (ppm/° C.) (TD direction) Support film |
|---|---|---|---|---|---|---|---|
| 1 | — | — | 20 | 700 | 5.5 | 18.2 | 16.5 |
| 2 | — | — | 10 | 600 | 5.5 | 18.2 | 16.5 |
| 3 | — | — | 50 | 600 | 5.5 | 18.2 | 16.5 |
| 4 | — | — | 30 | 730 | 5.5 | 18.0 | 16.5 |
| 5 | — | — | 30 | 800 | 5.6 | 17.9 | 16.5 |
| 6 | — | — | 600 | 180 | 5.4 | 16.7 | 14.8 |
| 7 | — | — | 700 | 80 | 5.3 | 17.2 | 14.8 |
| 8 | 1 | 2.00 | 20 | 400 | 5.3 | 17.6 | 14.8 |
| 9 | — | — | 1100 | 1300 | 5.5 | 16.0 | 14.8 |
| 10 | 2 | 1.50 | 270 | 200 | 5.0 | 18.7 | 14.8 |
| 11 | 2 | 1.50 | 20 | 30 | 5.0 | 18.7 | 14.8 |
| 12 | — | — | 10 | 1700 | 5.6 | 17.0 | 16.5 |
| 13 | — | — | 30 | 350 | 5.4 | 19.7 | 16.5 |
| 14 | 1 | 2.00 | 45 | 20 | 5.4 | 19.0 | 16.5 |
| 15 | 2 | 1.50 | 700 | 20 | 5.1 | 20.0 | 16.5 |
| 16 | 4 | 1.50 | 180 | 1100 | 8.5 | 17.7 | 13.8 |
| 17 | 6 | 1.33 | 1100 | 90 | 7.8 | 20.0 | 13.8 |
| 18 | 6 | 1.33 | 1100 | 90 | 7.8 | 20.0 | 13.8 |
| 19 | 4 | 1.50 | 180 | 1100 | 8.5 | 16.6 | 13.8 |

TABLE 2

| Comparative Example | Support film Product name | Support film Film thickness (μm) | Support film Varnish | Adhesive layer Film thickness (μm) | Adhesive layer Adhesive layer/ support film (thickness ratio) | Adhesive layer Tg (° C.) | Adhesive layer 5% weight reduction temperature (° C.) | Adhesive layer Elastic modulus (MPa, 230° C.) | Non-adhesive layer Varnish |
|---|---|---|---|---|---|---|---|---|---|
| 1 | 25SGA | 25 | 2 | 2 | 0.08 | 187 | 429 | 5 | — |
| 2 | 25SGA | 25 | 2 | 1 | 0.04 | 187 | 429 | 5 | — |
| 3 | 125SGA | 125 | 1 | 25 | 0.2 | 195 | 421 | 7 | — |
| 4 | 50SGA | 50 | 1 | 25 | 0.5 | 195 | 421 | 7 | — |
| 5 | 125SGA | 125 | 1 | 25 | 0.2 | 195 | 421 | 7 | — |
| 6 | 25SGA | 25 | 2 | 10 | 0.4 | 187 | 429 | 5 | 3 |
| 7 | 125SGA | 125 | 4 | 25 | 0.2 | 230 | 451 | 150 | — |
| 8 | 125SGA | 125 | 5 | 25 | 0.2 | 240 | 410 | 300 | — |
| 9 | 125SGA | 125 | 7 | 25 | 0.2 | 182 | 380 | <1 | — |

| Comparative Example | Non-adhesive layer Film thickness (μm) | Adhesive layer/ non-adhesive layer (thickness ratio) | Warpage amount (μm) Immediately after attachment | Warpage amount (μm) After moisture absorption 24° C./ 50% RH/24 h | Elastic modulus (GPa) Temporary protective film (30° C.) | CTE (ppm/° C.) (TD direction) Temporary protective film | CTE (ppm/° C.) (TD direction) Support film |
|---|---|---|---|---|---|---|---|
| 1 | — | — | 3000 | 4800 | 9.4 | 14.8 | 13.8 |
| 2 | — | — | 3500 | 5700 | 9.4 | 14.2 | 13.8 |
| 3 | — | — | 3300 | 3800 | 9.0 | 30.7 | 23.0 |
| 4 | — | — | 3000 | 3600 | 8.4 | 21.0 | 17.0 |
| 5 | — | — | 3300 | 3800 | 8.4 | 31.0 | 23.0 |
| 6 | 10 | 1.00 | 2000 | 3200 | 7.0 | 25.0 | 13.8 |
| 7 | — | — | 3300 | 3800 | 8.4 | 30.7 | 23.0 |
| 8 | — | — | 3000 | 3500 | 8.4 | 30.0 | 23.0 |
| 9 | — | — | 3300 | 3800 | 8.4 | 30.0 | 23.0 |

REFERENCE SIGNS LIST

1: support film, 2: adhesive layer, 3: non-adhesive layer, 10, 10': temporary protective film, 11: lead frame, 11a: die pad, 11b: inner lead, 12: wire, 13: sealing layer, 14: semiconductor element, 20: sealing molded body, 30: temporary protective film-attached lead frame, 31: winding core, 32: side plate, 33: reel body, 40: packaging bag, 50: package, 60: packing box, 70: packing material, 100: semiconductor device.

The invention claimed is:

1. A temporary protective film for semiconductor sealing molding, comprising a support film and an adhesive layer provided on one surface or both surfaces of the support film,
wherein the adhesive layer contains an aromatic polyether amideimide,
wherein the support film comprises a film of an aromatic polyimide,
wherein an elastic modulus at 30° C. of the temporary protective film is 9 GPa or less, and
wherein a coefficient of linear expansion at 30° C. to 200° C. of the temporary protective film is greater than or equal to 16 ppm/° C. and less than or equal to 20 ppm/° C. in at least one in-plane direction of the temporary protective film.

2. The temporary protective film for semiconductor sealing molding according to claim 1, wherein an elastic modulus at 230° C. of the adhesive layer is 1 MPa or more.

3. The temporary protective film for semiconductor sealing molding according to claim 1,
wherein the adhesive layer is provided on the one surface of the support film, and
a ratio of a thickness of the adhesive layer to a thickness of the support film is 0.2 or less.

4. The temporary protective film for semiconductor sealing molding according to claim 1,
wherein the adhesive layer is provided on the one surface of the support film, and
the temporary protective film further includes a non-adhesive layer provided on a surface of the support film, the surface being on the opposite side of the surface provided with the adhesive layer.

5. The temporary protective film for semiconductor sealing molding according to claim 4, wherein a ratio of a thickness of the adhesive layer to a thickness of the non-adhesive layer is 1.0 to 2.0.

6. A reel body, comprising a winding core and the temporary protective film for semiconductor sealing molding according to claim 1 wound around the winding core.

7. A package, comprising the reel body according to claim 6; and a packaging bag accommodating the reel body.

8. A packing material, comprising the package according to claim 7; and a packing box accommodating the package.

9. A temporary protective film-attached lead frame, comprising:
a lead frame having a die pad and an inner lead; and
the temporary protective film for semiconductor sealing molding according to claim 1,
wherein the temporary protective film is attached to the lead frame in a direction in which the adhesive layer of the temporary protective film comes into contact with one surface of the lead frame, wherein the temporary protective film runs parallel to a shorter side of the lead frame in a case where the outer periphery of the lead frame has a rectangular shape, and parallel to any one side in a case where the outer periphery of the lead frame has a square shape.

10. A temporary protective film-attached sealing molded body, comprising:
a lead frame having a die pad and an inner lead;
a semiconductor element mounted on the die pad;
a wire connecting the semiconductor element and the inner lead;
a sealing layer sealing the semiconductor element and the wire; and
the temporary protective film according to claim 1,
wherein the adhesive layer of the temporary protective film is attached to a surface of the lead frame, the surface being on the opposite side of the surface where the semiconductor element is mounted.

11. A method for producing a semiconductor device, comprising, in the following order:
a step of attaching the temporary protective film for semiconductor sealing molding according to claim 1 on one surface of a lead frame having a die pad and an inner lead, in a direction in which an adhesive layer of the temporary protective film comes into contact with the lead frame, wherein the temporary protective film runs parallel to a shorter side in a case where the outer periphery of the lead frame is a rectangular shape, and parallel to any one side in a case where the outer periphery of the lead frame has a square shape;
a step of mounting a semiconductor element on a surface of the die pad, the surface being on the opposite side of the temporary protective film;
a step of providing a wire for connecting the semiconductor element and the inner lead;
a step of forming a sealing layer sealing the semiconductor element and the wire, and thereby obtaining a sealing molded body having the lead frame, the semiconductor element, and the sealing layer; and
a step of peeling off the temporary protective film from the sealing molded body.

12. The temporary protective film for semiconductor sealing molding according to claim 1, wherein a thickness of the support film is 100 μm or less, and a ratio of a thickness of the adhesive layer to a thickness of the support film is 0.2 or less.

13. The temporary protective film for semiconductor sealing molding according to claim 1, wherein a thickness of the support film is 50 μm or less.

14. The temporary protective film for semiconductor sealing molding according to claim 13, wherein a ratio of a thickness of the adhesive layer to a thickness of the support film is 0.1 or less.

15. The temporary protective film for semiconductor sealing molding according to claim 1, wherein a ratio of a thickness of the adhesive layer to a thickness of the support film is more than 0.05 and less than or equal to 0.2.

16. A temporary protective film for semiconductor sealing molding, comprising a support film and an adhesive layer provided on one surface or both surfaces of the support film,
wherein the adhesive layer contains an aromatic polyether amideimide,
wherein the support film comprises a film of a an aromatic polyimide,
wherein a ratio of a thickness of the adhesive layer to a thickness of the support film is 0.2 or less
wherein an elastic modulus at 30° C. of the temporary protective film is 9 GPa or less, and
wherein a coefficient of linear expansion at 30° C. to 200° C. of the temporary protective film is greater than or equal to 16 ppm/° C. and less than or equal to 20 ppm/° C. in at least one in-plane direction of the temporary protective film.

\* \* \* \* \*